United States Patent
Bonora et al.

(10) Patent No.: US 7,290,813 B2
(45) Date of Patent: Nov. 6, 2007

(54) ACTIVE EDGE GRIP REST PAD

(75) Inventors: Anthony C. Bonora, Woodside, CA (US); Roger G. Hine, San Carlos, CA (US); D. Wayne Nobles, Jr., Saratoga, CA (US); Norma B. Riley, Durham, CA (US)

(73) Assignee: Asyst Technologies, Inc., Fremont, CA (US)

( * ) Notice: Subject to any disclaimer, the term of this patent is extended or adjusted under 35 U.S.C. 154(b) by 180 days.

(21) Appl. No.: 11/014,401

(22) Filed: Dec. 16, 2004

(65) Prior Publication Data

US 2006/0131903 A1 Jun. 22, 2006

(51) Int. Cl.
*B65G 49/07* (2006.01)

(52) U.S. Cl. .............. 294/1.1; 294/103.1; 294/902; 414/941

(58) Field of Classification Search ............ 294/1.1, 294/103.1, 104, 902; 414/941
See application file for complete search history.

(56) References Cited

U.S. PATENT DOCUMENTS

| | | | |
|---|---|---|---|
| 4,184,188 A | | 1/1980 | Briglia |
| 5,280,983 A | | 1/1994 | Maydan et al. |
| 5,380,137 A | | 1/1995 | Wada |
| 5,469,035 A | | 11/1995 | Lowrance |
| 5,711,647 A | * | 1/1998 | Slocum ............ 414/751.1 |
| 5,980,194 A | | 11/1999 | Freerks et al. |
| 5,988,971 A | | 11/1999 | Fossey et al. |
| 6,116,848 A | | 9/2000 | Thomas et al. |
| 6,155,773 A | | 12/2000 | Ebbing et al. |
| 6,167,893 B1 | * | 1/2001 | Taatjes et al. ............ 134/147 |
| 6,256,555 B1 | | 7/2001 | Bacchi et al. |
| 6,322,119 B1 | | 11/2001 | Schmidt et al. |
| 6,540,468 B1 | | 4/2003 | Blattner et al. |
| 2003/0035711 A1 | | 2/2003 | Gilchrist |
| 2004/0048474 A1 | | 3/2004 | Asano |

FOREIGN PATENT DOCUMENTS

| | | |
|---|---|---|
| EP | 0 228 973 B1 | 4/1991 |
| EP | 0820 091 A2 | 1/1997 |
| EP | 1 063 683 A | 12/2000 |
| GB | 2 171 978 A | 3/1986 |
| WO | WO94/19821 | 9/1994 |
| WO | WO9916111 | 4/1999 |

* cited by examiner

*Primary Examiner*—Dean J Kramer
(74) *Attorney, Agent, or Firm*—Martine Penilla & Gencarella, LLP

(57) ABSTRACT

The present invention comprises a distal rest pad for supporting a portion of a wafer seated on an end effector. In one embodiment, the rest pad includes a bottom support pad and an edge stop. Each element is mounted separately to the distal end of a support plate. The bottom support pad includes an inclined surface that transitions to a substantially horizontal surface at its distal end. The edge stop has a substantially vertical wafer contact surface that the peripheral edge of a wafer eventually contacts as the wafer is urged towards the distal rest pad. In another embodiment, the bottom support pad comprises an inclined surface. In yet another embodiment, the distal rest pad comprises a single structure. This distal rest pad includes a backstop portion and a bottom support separated by a particle collection groove. The bottom support may include an inclined lead-in surface that transitions into a flat contact surface or only comprise an inclined lead-in surface.

17 Claims, 9 Drawing Sheets

Detail D

ACTIVE EDGE GRIP REST PAD

FIELD OF THE INVENTION

The present invention generally relates to end effectors for supporting and transporting semiconductor wafers. More specifically, the present invention is a distal rest pad for supporting a portion of a wafer.

BACKGROUND

Conventional edge grip end effectors have wafer grip pads with included angles that create problems solved by this invention. Conventional distal rest pads often have an inside corner into which the edge of the wafer is urged by a rear pusher to mechanically retain the wafer on the end effector.

FIG. 1 illustrates an embodiment of a spatula-shaped end effector 10 of this invention for transferring semiconductor wafers, such as a wafer 12 (shown transparent to reveal underlying structures), to and from a wafer cassette (not shown). End effector 10 is adapted to receive and securely hold wafer 12 and transfer it to and from a cassette for processing. Wafers having diameters of less than 150 mm are typically spaced apart at a 4.76 mm (3/16 inch) pitch distance; 200 mm diameter wafers are typically spaced apart at a 6.35 mm (1/4 inch) pitch distance; and 300 mm wafers are typically spaced apart at a 10 mm (0.394 inch) pitch distance.

In general, the end effector 10 enters a wafer cassette to retrieve a wafer 12. The end effector 10 is then finely positioned and actuated to grip a periphery 14 of wafer 12, remove wafer 12 from the cassette (not shown), and transfer wafer 12 to a processing station (not shown) for processing. End effector 10 may then, if necessary, reinsert wafer 12 into the cassette, release wafer 12, and withdraw from the cassette.

End effector 10 is operably coupled to robot arm (not shown) at a proximal end 20 and extends to a distal end 22. End effector 10 receives wafer 12 between proximal end 20 and distal end 22 and includes at least two and, preferably, four rest pads upon which wafer 12 is initially loaded. Two distal rest pads are located at, or adjacent to, distal end 22 of end effector 10; and at least one, but preferably two proximal rest pads are located toward proximal end 20.

Semiconductor wafers have an annular exclusion zone, or inactive portion, that extends inwardly about 1 mm to about 5 mm from periphery 14 and completely surrounding wafer 12. Exclusion zone 30 is described as part of an industry standard wafer edge profile template in Semiconductor Equipment and Materials International ("SEMI") specification M10298, pages 18 and 19. As a general rule, no part of end effector 10 may contact wafer 12 beyond the inner boundary of exclusion zone 30. The distance between distal rest pads and the distance between proximal rest pads each have an angular extent greater than any feature on wafer 12 to guarantee that wafer 12 is gripped only within exclusion zone 30.

Conventional rest pad designs often use overhung or sloped tip pads having an included angle between them. An end effector must move forward while also moving down so that the drop off trajectory is sloped greater than the tip angle. Accordingly, the final resting position of the wafer on the end effector is effected by variations in the height of the wafer during drop off. The end effector must decelerate in a horizontal direction at the time of drop off that will result in the wafer skidding on the stationary wafer supports. If the wafer is dropped off quickly (as is desirable for high throughput), the end effector will bounce chaotically during drop off due to the cantilever and changes in acceleration over this short motion. Coordinating the vertical and horizontal motions of the end effector will therefore vary from wafer to wafer at the exact moment of contact between the wafer and the stationary supports. Requiring horizontal motion to pick up or drop off a wafer effects the repeatability of the final drop off and the speed at which the drop off can occur for a given repeatability requirement.

FIG. 3 shows a substantially flat embodiment of a conventional distal rest pad 24. In this embodiment, the distal rest pad 24 includes a pad portion 32 and a backstop portion 34. The pad portion 32 is substantially parallel to an imaginary plane 36 extending through wafer 12. The backstop portion 34 is inclined toward wafer 12 at a backstop angle 38 relative to a line perpendicular to plane 36. Pad portion 32 has a length 40 that is a function of the depth of exclusion zone 30. The wafer 12 typically has a substantially rounded peripheral edge and contacts rest pads 24 only within exclusion zone 30. The wafer 12 is gripped by urging it into the included: angle formed between pad portion 32 and backstop portion 34.

FIG. 4 shows an inclined embodiment of a conventional distal rest pad 24. The distal rest pad 24 includes an inclined pad portion 42 and a backstop portion 34. In this embodiment, the inclined pad portion 42 is inclined away from wafer 12 at a rest pad angle 44. The backstop portion 34 is inclined toward wafer 12 at backstop angle 38. The inclined pad portion 42 has a length 40 that is a function of the depth of exclusion zone 30. Similar to the FIG. 3 embodiment, the wafer 12 typically has a substantially rounded peripheral edge and contacts rest pads 24 only within exclusion zone 30. The wafer 12 is gripped by urging it into the included angle formed between pad portion 42 and backstop portion 34. In the inclined embodiment, there is substantially no contact between rest pad 24 and a bottom surface 46 of wafer 12. Both the flat and inclined embodiments of distal rest pads 24 have a height 48 that substantially reaches but does not extend beyond the top surface of wafer 12.

There are several problems with the conventional distal rest pad designs shown in FIGS. 3-4. Among other things, it is difficult to release and place the wafer precisely and cleanly on the end effector because the wafer must move horizontally (as opposed to purely vertically) relative to the grip pads to be released from the conventional distal rest pad. In addition, the included angles formed between the contact surfaces of the conventional distal rest pad create particle traps that could lead to wafer contamination. Further, the pads support a wafer in an indeterminate position due to variations in the edge shape of the wafer and difficulty in manufacturing consistent internal angles on the rest pads. Depending on the specific geometry and coefficient of friction of the distal rest pads, it may be impossible to fully grip certain "sticky" wafers regardless of the pusher force.

What is needed, therefore, is a low-profile distal rest pad that eliminates the particle trapping characteristics of conventional rest pads, reduces the overall height of the support plate and may be manufactured from more than one material. The present invention provides, among other things, all of these features.

SUMMARY OF THE INVENTION

One object of the present invention is to provide an end effector with a distal rest pad that allows a wafer to be placed on the support plate using predominantly vertical motion of the end effector. Eliminating one axis of motion (horizontal motion) normally required to place a wafer on an end effector allows for precise and repeatable placement of the wafer on pins or shelves.

Another object of the present invention is to provide a distal rest pad that results in minimal sliding between the edge stop and the peripheral edge of the wafer. Sliding the wafer on a rest pad generates particulates which may contaminate the wafer. In one embodiment, the edge stop includes a wafer contact surface that forms an obtuse angle with the wafer contact surface of the bottom support pad.

Yet another object of the present invention is to provide an end effector whereby the wafer position may be determined independently of the radii of the wafer's edge.

Another object of the present invention is to provide a distal rest pad that does not form an inside corner between the edge stop and the bottom support pad. The inside corner of a conventional distal rest pad traps particles between the wafer and the rest pad, which potentially may damage the wafer. In one embodiment, the distal rest pad comprises two separate and spaced apart elements. Thus, particles generated from, for example, the wafer sliding up a portion of the distal rest, will travel away from the rest pad and into the space between the two elements.

Another object of the present invention is to provide a distal rest pad that is easy to measure and inspect. In one embodiment, the distal rest pad includes two separate elements—an edge stop and a bottom rest pad. The edge stop and the bottom rest pad individually mount onto the support plate. Conversely, the edge stop and bottom support pad may be removed separately from the support plate and inspected individually. Additionally, if the edge stop or bottom support plate become damaged, it can be replaced without having to replace the entire distal rest pad.

Still another object of the present invention is to provide a low profile distal rest pad. The distal rest pad travels frequently into and out of wafer cassettes. The distal rest pad is likely the highest portion of the support plate. A low profile distal rest pad reduces the overall height of the support plate, which reduces the likelihood of scratching a wafer when the end effector enters or exits a cassette.

Yet another object of the present invention is to provide a distal rest pad whereby the two separate elements of the distal rest pad may comprise different materials. In one embodiment, the distal rest pad comprises a bottom support pad and an edge stop. To optimize the performance characteristics of the distal rest pad, the bottom support pad may comprise a static dissipative material to prevent the accumulation of charge on a wafer being held on the end effector. The edge stops, in contrast, may comprise a material that has better wear and friction properties.

DETAILED DESCRIPTION OF THE INVENTION

Figure 1:
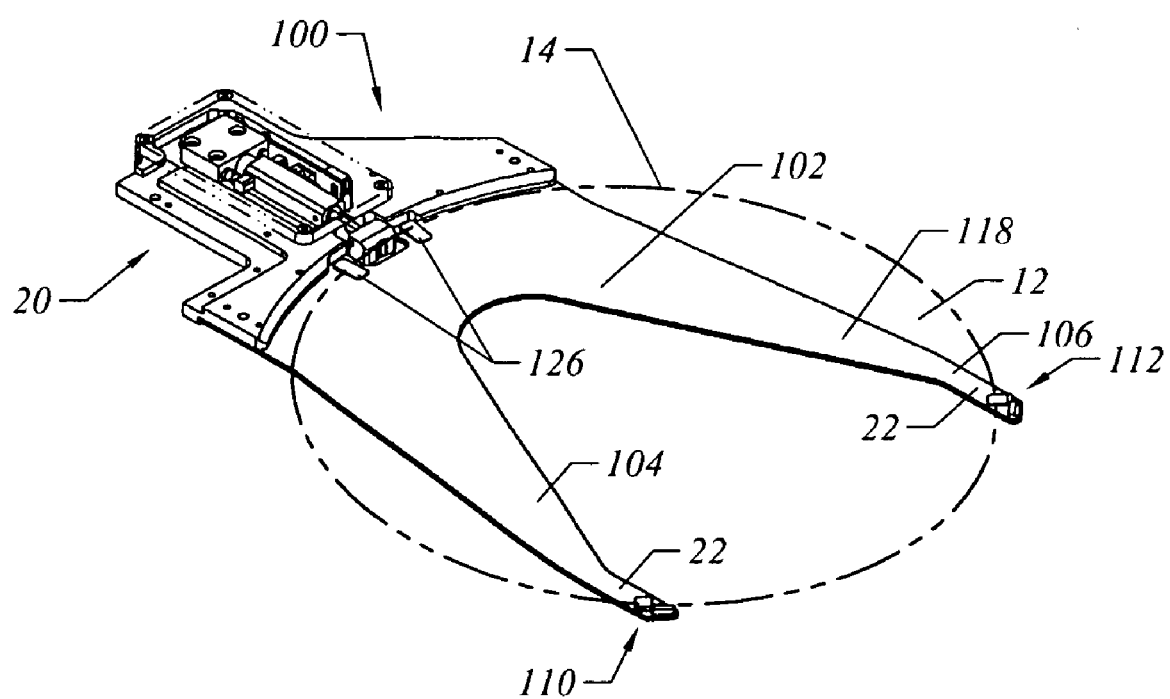
FIG. 1 is a perspective view of an embodiment of the present invention.
Figure 2:
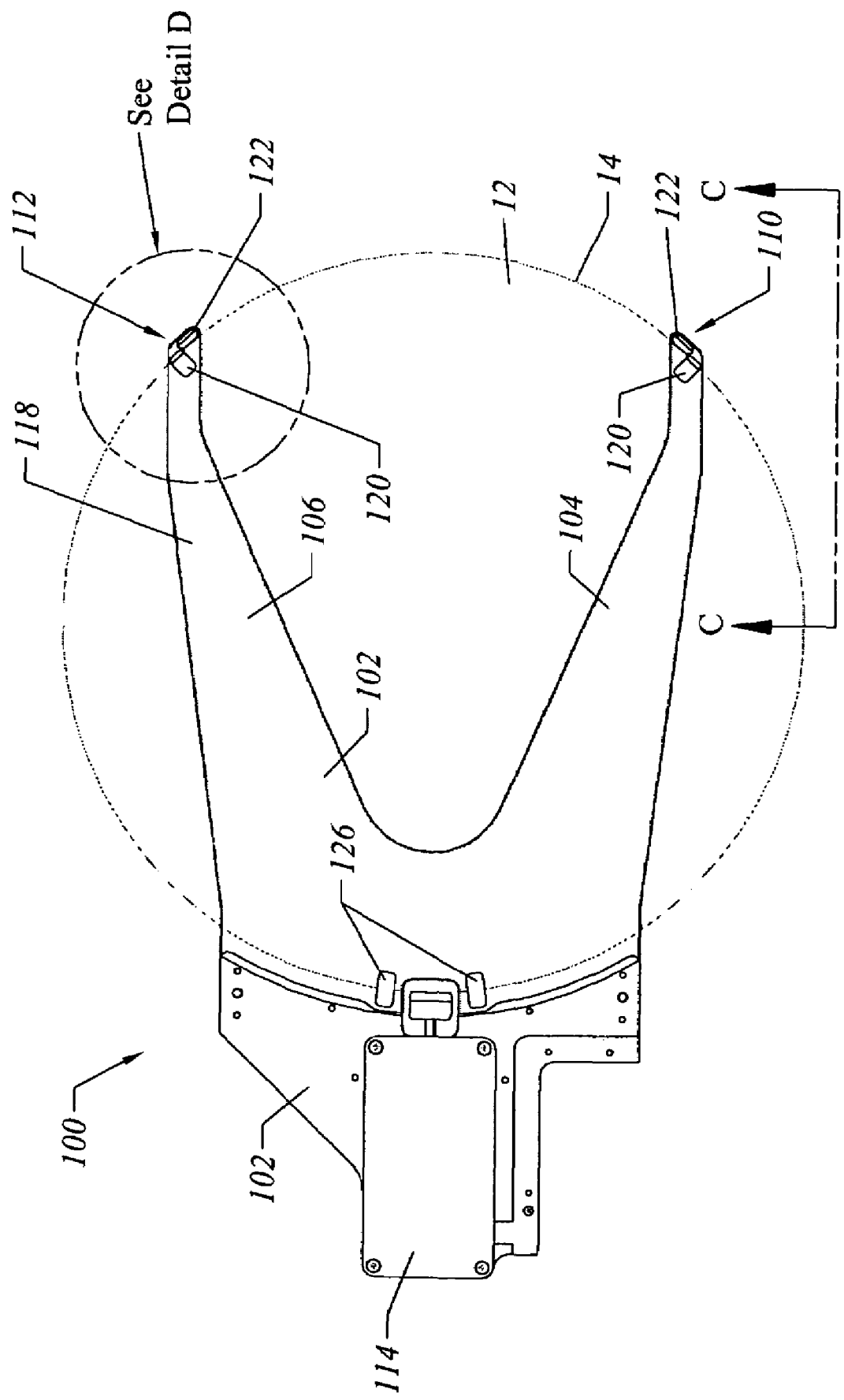
FIG. 2 is a plan view of the end effector shown in FIG. 1.

FIGS. 1-2 illustrate an embodiment of an end effector. The end effector 100 generally comprises a support plate 102 having a first finger 104 and a second finger 106 located at a distal end 110 of the support plate 102. Mounting holes are located throughout the support plate 102. As will be discussed in more detail later, each mounting hole is adapted to receive a specific element (e.g., distal rest pad, proximal rest pad, etc.). The end effector 100 shown in FIGS. 1-2 is merely an example and the present invention is not limited for use with this specific configuration.

The end effector 100 is configured to support and transport a wafer 12. In order to support a wafer 12, the end effector 100 includes, among other things, a first distal rest pad 110 and a second distal rest pad 112, a pair of proximal rest pads 126, and a pusher device 114. The pusher device 114 urges a wafer 12 seated on the support plate 102 towards the first distal rest pad 110 and the second distal rest pad 112 in order to secure the wafer 12. In this embodiment, the wafer 12 is supported by four rest pads. Each rest pad preferably contacts the bottom surface of the wafer 12 only in the outermost perimeter zone, which is preferably no more than 1-2 mm from the peripheral edge 14 of the wafer 12 (commonly referred to as the "exclusion zone"). The end effector 100 may also include fewer distal or proximal rest pads.

The first distal rest pad 110 and the second distal rest pad 112 are preferably similar. Therefore, for purposes of describing the distal rest pads in this application, only the first distal rest pad 110 will be referenced. FIG. 2 provides a more detailed illustration of an embodiment of the distal rest pad 110. In the FIG. 2 embodiment, each distal rest pad 110 includes a bottom support pad 120 and an edge stop 122. The bottom support pad 120 and the edge stop 122 are separate structures. The bottom support pad 120 supports the weight of a wafer 12 seated on the end effector. The edge stop 122 generally provides a backstop that prevents the wafer 12 from sliding off the end effector.

Figure 5:
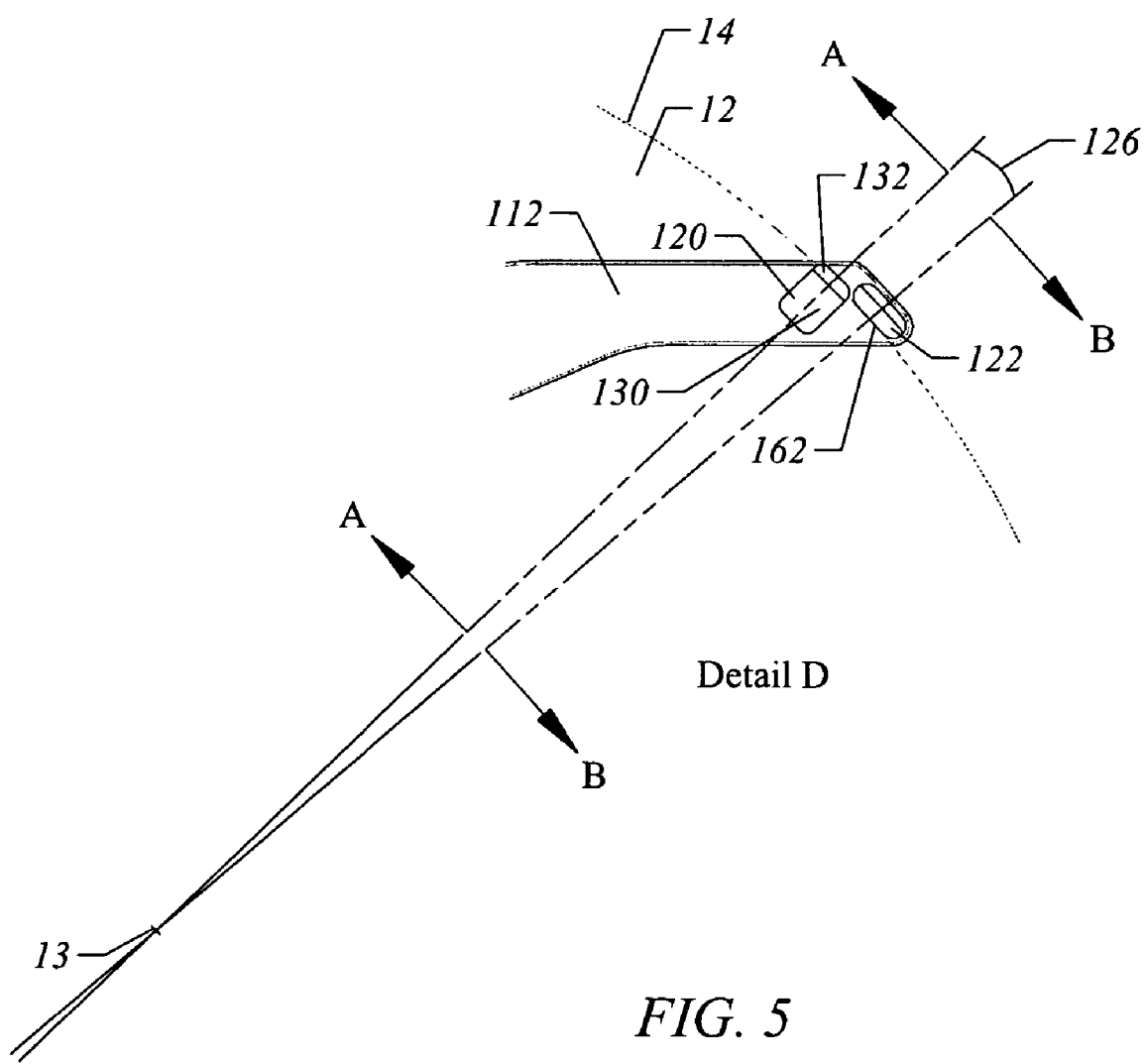
FIG. 5 is an enlarged plan view of the distal end of the end effector shown in FIG. 1, providing a detailed view of an embodiment of the rest pad.

FIG. 5 provides an enlarged view of Detail D shown in FIG. 2. As shown in FIG. 5, the first finger 114 includes a distal rest pad 110 that comprises two separate structures—a bottom support pad 120 and an edge stop 122. The bottom support pad 120 and the edge stop 122 are located proximal to each other to restrain the wafer 12 in both a horizontal and vertical direction. FIG. 5 specifically shows the wafer 12 in a "gripped" position whereby the bottom surface of the wafer 12 is seated on the bottom support pad 120 and the peripheral edge 14 of the wafer 12 is contacting the edge stop 122. The placement of the edge location features provides better ability to overcome frictional effects and reliably center the wafer.

The bottom support pad 120 and the edge stop 122 are offset from one another. For example, FIG. 5 illustrates a cutaway line A-A passing through the longitudinal center axis (from the plan view) of the bottom support pad 120 and a cutaway line B-B passing through a center axis (from the plan view) of the edge stop 122. Each cutaway line passes through the center 13 of the wafer 12, yet intersects a different portion of the wafer's perimeter. In other words, the cutaway line A-A and the cutaway line B-B do not coincide. This prevents the bottom surface of the wafer 12 from contacting the bottom support pad 120 along the same cutaway line that the peripheral edge 14 of the wafer 12 contacts the edge stop 122.

The bottom support pad 120 generally supports the weight of the wafer 12 while the edge stop 122 provides a backstop surface to prevent the wafer 12 from sliding off the end effector 100. As shown in FIG. 5, the cutaway line A-A passing through the bottom support pad 120 and the cutaway line B-B passing through the edge stop 122 forms an angle 126 between them. The angle 126 may vary, which will either separate the bottom support pad 120 further from the edge stop 122 (greater angle 126) or bring them closer together (smaller angle 126). The angle 126 is preferably greater then zero degrees so that the bottom support pad 120 is radially offset from the edge stop 122. The configuration of the distal rest pad 110 may vary as long as the edge stop 122 contacts the peripheral edge 14 of the wafer 12 at the same time that the bottom support pad 120 contacts the bottom surface of the wafer 12 within the exclusion zone 30.

Figure 7A:
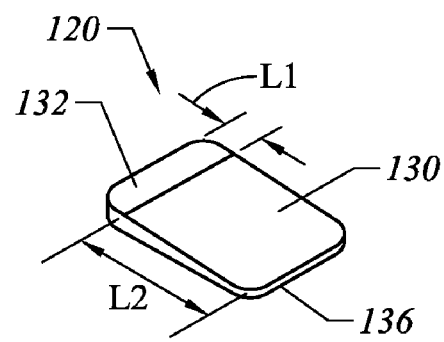
FIG. 7A is a top perspective view of the bottom support pad shown in FIG. 6A.
Figure 7C:
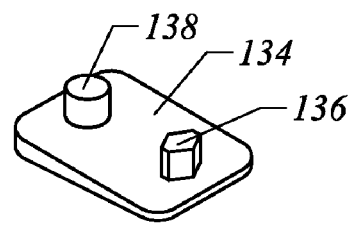
FIG. 7C is bottom perspective view of the bottom support pad shown in FIG. 6A.
Figure 7B:
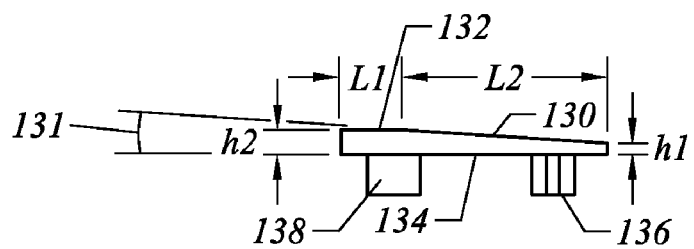
FIG. 7B is a side elevation view of the bottom support pad shown in FIG. 6A.

FIGS. 7A-7C illustrate one embodiment of the bottom support pad 120. In this embodiment, the bottom support pad 120 includes a sloped contact surface 130 that transitions into a flat contact surface 132. The length L2 of the sloped contact surface 130 is preferably longer than the length L1 of the flat contact surface 132. As previously discussed above, the flat contact surface 132 preferably only contacts the bottom surface of the wafer 12 within the exclusion zone. A wafer 12 set on the end effector 100 will likely initially contact the sloped surface 130 because the bottom support pads 120 and the proximal rest pads are separated apart a distance greater than the diameter of the wafer. The pusher device 114 eventually contacts the peripheral edge of the wafer and urges the wafer up the sloped surface 130 towards the flat contact surface 132. The sloped surface 130 forms an angle 131 with the bottom mounting surface 134. There is no ideal angle 131. In fact, angle 131 may have a wide range of acceptable angles as the sloped surface 130 only contacts the peripheral edge of the wafer. Minimizing the contact area between the wafer's edge and the sloped surface 130 minimizes the amount of particulates generated, if any, while the wafer slides up the sloped surface 130.

The bottom surface of the wafer preferably rests on the flat contact surface 132 as the wafer is transported. The length L1 of the flat contact surface 132 is preferably short (e.g., 3-5 mm) since the flat contact surface 132 preferably does not contact the bottom surface of the wafer more than 1-2 mm from the peripheral edge of the wafer. Positioning the bottom support pads 120 such that the flat contact surface 132 supports the bottom surface of the wafer predetermines the final height of the wafer's top surface regardless of the shape of the wafer's peripheral edge 14. Thus, the correct wafer ride height on the end effector 100 can be easily verified by inspecting and measuring the bottom support pad 120 with, by way of example only, calipers (proper height shown as h5 in FIG. 9B).

Figure 6A:
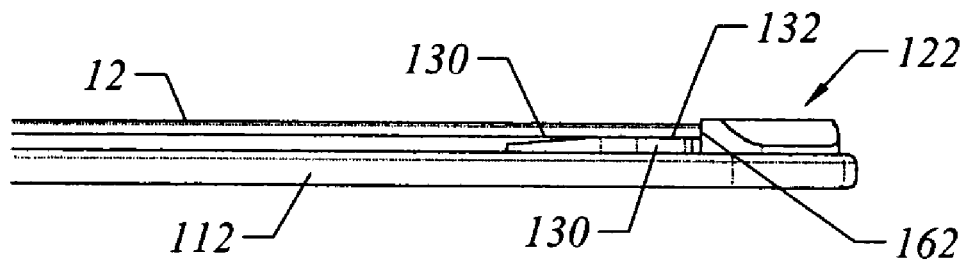
FIG. 6A is an side elevation view of an embodiment of the present invention.
Figure 6B:
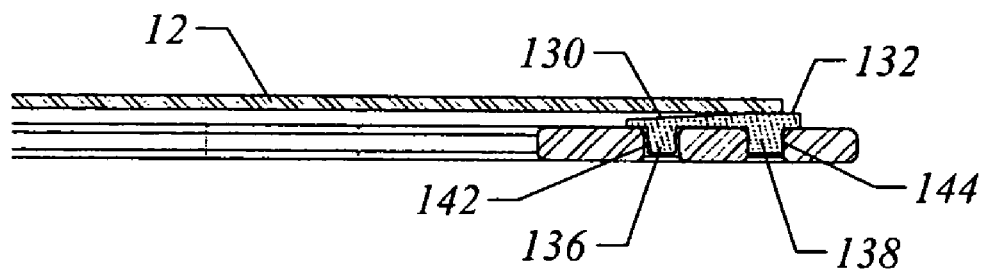
FIG. 6B is an cross-sectional view of an embodiment of a bottom support pad.

FIGS. 7B and 7C best illustrate the bottom mounting surface 134 of the bottom support pad 120. In this embodiment, the bottom mounting surface 134 includes two protrusions 136 and 138. The bottom support pad 120 may include fewer or more protrusions. By way of example only, protrusion 136 comprises a hexagonal column and protrusion 138 comprises a cylindrical column. The protrusions are not, however, limited to any particular shape. FIG. 6B illustrates that the protrusion 136 is inserted into mounting hole 142 and protrusion 138 is inserted into the mounting hole 144. The protrusions 136 and 138 align the bottom support pad 120 on the support plate 102. The protrusions 136 and 138 preferably comprise different shapes so that the bottom support pad 120 is not misaligned on the support plate 102. For example, the mounting hole 142, in this embodiment, comprises a hexagonal shape and the mounting hole 144 comprises a cylindrical shape. Thus, the bottom support pad 120 may be mounted to the support plate 102 in only one manner—as shown in FIG. 6B. The bottom support pad 120 may be mounted to the support plate 102 in any manner known in the art (e.g., press fit, secured by epoxy, etc.) and does not require further description.

Figure 8A:
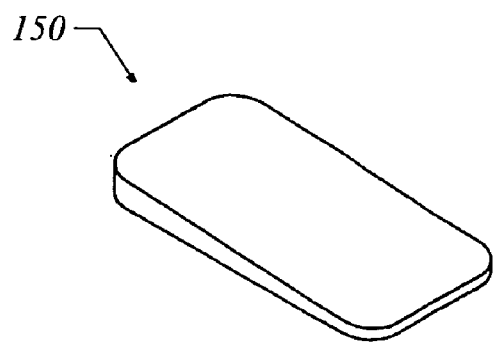
FIG. 8A is a top perspective view of a second embodiment of a bottom support pad.
Figure 8C:
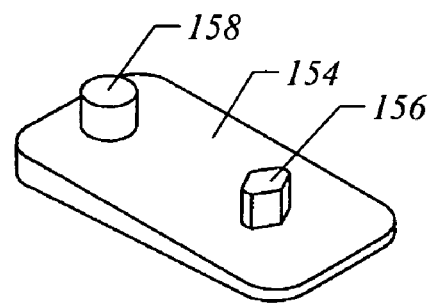
FIG. 8C is bottom perspective view of the bottom support pad shown in FIG. 8A.
Figure 8B:
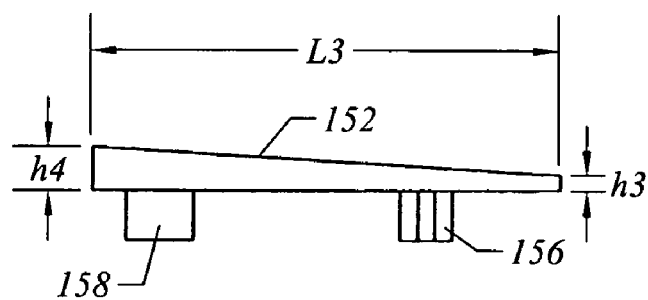
FIG. 8B is a side elevation view of the support pad shown in FIG. 8A.

FIGS. 8A-8C illustrate a second embodiment of a bottom support pad 150. In this embodiment, the bottom support pad 150 includes one wafer contact surface—a sloped contact surface 152. The sloped contact surface 152 provides a support surface for the wafer. The pusher device 114 eventually contacts the peripheral edge of the wafer and urges the wafer up the sloped contact surface 152 towards edge stop 122 to secure the wafer 12 on the end effector. The sloped contact surface 152 preferably only contacts the peripheral edge of the wafer and thus minimizes the amount of particulates generated, if any, while the wafer slides up the sloped contact surface 152. The length L3 of the bottom support pad 150 is similar to the total length of the bottom support pad 120 (e.g., L1+L2).

The bottom support pad 150 also includes a bottom mounting surface 154. FIGS. 8B-8C illustrate that the bottom mounting surface 154 includes two protrusions 156 and 158. The bottom support pad 150 may include fewer or more protrusions. In this embodiment, protrusion 156 comprises a hexagonal column and protrusion 158 comprises a cylindrical column. The protrusions are not, however, limited to any particular shape and may comprise, for example, a rectangular shape or an octagonal shape. The protrusions align the bottom support pad 150 on the support plate 102. Similar to the bottom support pad 120 (see FIGS. 7A-7C), the protrusions 156 and 158 are inserted into the appropriate mounting holes to align the bottom support pad 150 on the support plate 102.

Figure 9A:
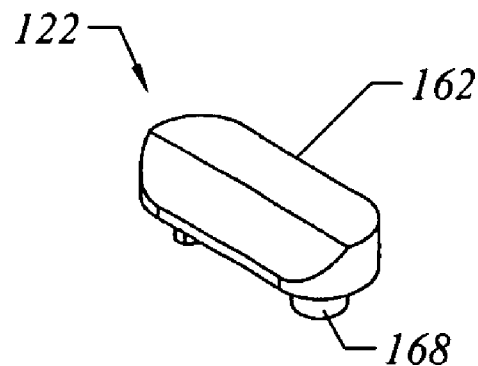
FIG. 9A is a top perspective view of an embodiment of an edge stop.
Figure 9C:
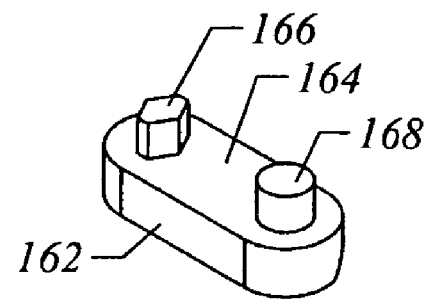
FIG. 9C is bottom perspective view of the edge stop shown in FIG. 9A.
Figure 9B:
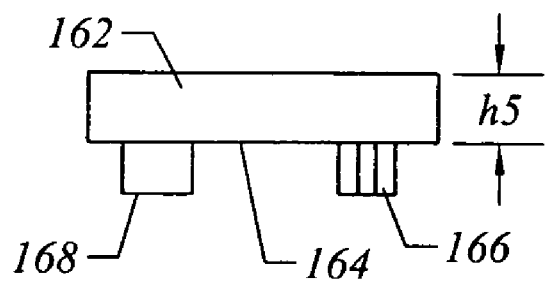
FIG. 9B is a side elevation view of the edge stop shown in FIG. 9A.

FIGS. 9A-9C illustrate an embodiment of the edge stop 122. In this embodiment, the edge stop 122 includes a wafer contact surface 162. The wafer contact surface 162 faces inward towards the proximal end 20 of the support plate 102 when the edge stop 122 is mounted on the support plate 102. The edge stop 122 is positioned on the support plate 102 such that the peripheral edge 14 of the wafer 12 eventually contacts the wafer contact surface 162 as the wafer 12 moves up the bottom support pad. Thus, the edge stop 122 prevents the wafer 12 from sliding off the support plate 102.

Figure 6C:
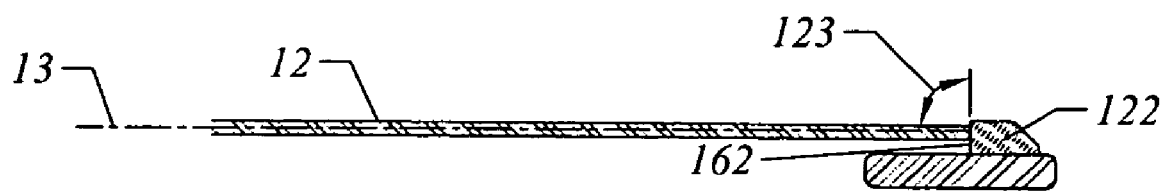
FIG. 6C is an cross-sectional view of an embodiment of an edge stop.

The wafer contact surface 162 shown in FIGS. 9A-9C forms an angle 123 with an imaginary plane 13 passing through the wafer 12 (see FIG. 6C). In a preferred embodiment, the angle 123 comprises 90°. The angle 123 may also, however, comprise an angle greater than 90° with the imaginary plane 13 (e.g., 91°-95°). If the angle 123 is slightly greater than 90°, for example 92°, then the wafer 12 can be dropped off with pure vertical motion with no sliding between the wafer contact surface 162 and the wafer's peripheral edge 14. The angle 123 preferably does not form an angle less than 90° with the imaginary plane 13. The edge stop 122 also results in minimal sliding between the edge stop 122 and the wafer 12. Such sliding may generate particulate which may contaminate the wafer 12 or nearby wafers (e.g., within a wafer cassette).

The edge stop 122 preferably does not contact the peripheral edge 14 of the wafer 12 above the tangent point or most extreme perimeter of the peripheral edge 14. Therefore, it is not necessary that the edge stop 122 is taller than this contact point or the wafer itself. The profile of the edge stop 122 allows the support plate 102 to have a low overall height profile. For example, the highest portion of the support plate 102 would be the height of the edge stop 122 (see h5 shown in FIG. 9B).

The edge stop 122 includes a bottom mounting surface 164. FIGS. 9B-9C best illustrate that the bottom mounting surface 164, in this embodiment, includes two protrusions 166 and 168. The edge stop 122 may include fewer or more protrusions. In this embodiment, protrusion 166 comprises a hexagonal column and protrusion 168 comprises a cylindrical column. The protrusions are not, however, limited to any particular shape and may comprise, for example, a rectangular shape or an octagonal shape. The protrusions 166 and 168 are inserted into the appropriate mounting holes to align the edge stop 122 on the support plate 102.

The protrusions generally provide a method for locating and holding each support pad 120 and edge stop 122 on the support plate 102 without requiring pockets or more complex three dimensional features on the support plate 102 that would are difficult to fabricate in ceramic or carbon fiber composite materials. These materials often tend to be brittle and are prone to cracking when wall sections are too thin or the features too fine. The support pad 120 and edge stop 122 may also be bonded or affixed to the support plate 102 using a variety of possible methods known within the art.

Figure 3:
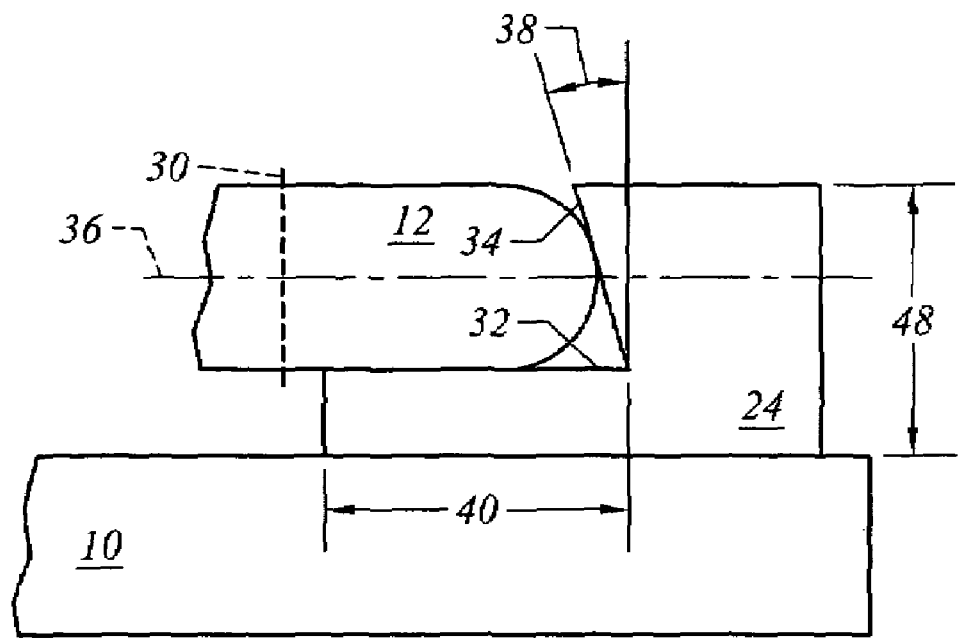
FIG. 3 is a side elevation view of an embodiment of a conventional rest pad, according to the prior art.
Figure 4:
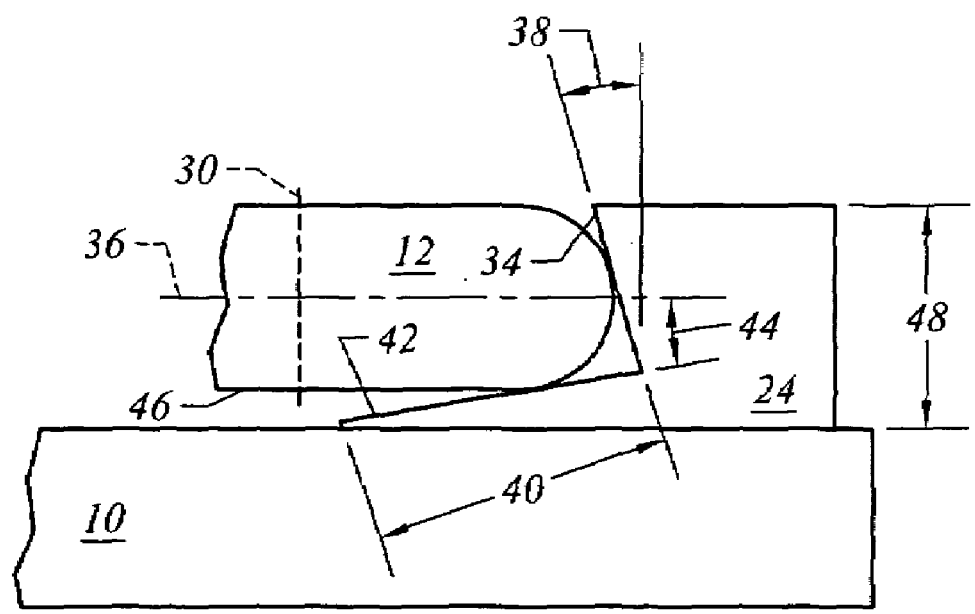
FIG. 4 is a side elevation view of a second embodiment of a conventional rest pad, according to the prior art.

There are several advantages to a distal rest pad having two separate elements. For example, the bottom support pad 120 and the edge stop 122 may comprise different materials. For example, the bottom support pad 120 may comprise a static dissipative material to prevent the accumulation of charge on a wafer being held on the support plate 102. The edge stop 122, which is more critical with regard to low friction and high wear resistance than the bottom support pad 120, may comprise a material with better wear and friction properties. Static dissipative materials tend to have inferior wear properties and higher coefficients of friction as compared to purely insulating polymers. Conventional distal rest pads (see FIGS. 3-4) are manufactured from a single piece of material and therefore, cannot optimize the properties of the rest pad versus the backstop.

One embodiment of the present invention supports the weight of the wafer 12 at multiple locations: a right distal tip, a left distal tip, and a proximal area near the pusher device. Each edge stop 122 is positioned in close proximity to each bottom support pad 120 so that the top surface of the wafer 12, while resting on the support pads, does not rise above the edge stops 122. At the proximal end 20 of the end effector 100, one embodiment includes two rest pads 126 located near the pusher device 114. Each pad 126 is preferably positioned in close proximity to one another so that they function essentially as one rest pad. This arrangement of rest pads allows a wafer 12, even if it is significantly warped, to rest on the end effector 100.

In addition, a distal rest pad comprising two separate structures provides for easier manufacturing with more consistent measurable surface finishes. For example, the conventional rest pad shown in FIGS. 3-4 includes an inside corner (corner formed between surfaces 32 and 34) that have to be milled. This is expensive and time consuming. The distal rest pad 110 eliminates this inside corner where particles tend to be pushed by a sliding wafer and then are trapped between the wafer and the pad. The wafer contact surfaces of the bottom support pad 120 and the edge stop 122 are easier to clean than the wafer contact surfaces of a conventional rest pad. Further, because the wafer contact surface 162 of each edge stop 122 is substantially vertical and there is no inside corner for the wafer to be wedged into, there is reduced tendency for the wafer 12 to bind in the distal rest pad 110 and fail to slide fully into a gripped position (see FIG. 2).

Using locating, and not gripping, contact pieces allows the wafer 12 to be placed on the support plate 102 using only vertical motion of the end effector without causing any horizontal movement of the wafer. More precise and repeatable placement of the wafer 12 on, for example, pins or shelves may be achieved. Only requiring vertical motion to drop off or pick up a wafer eliminates one variable (horizontal motion) and provides a more repeatable action.

Figure 10:
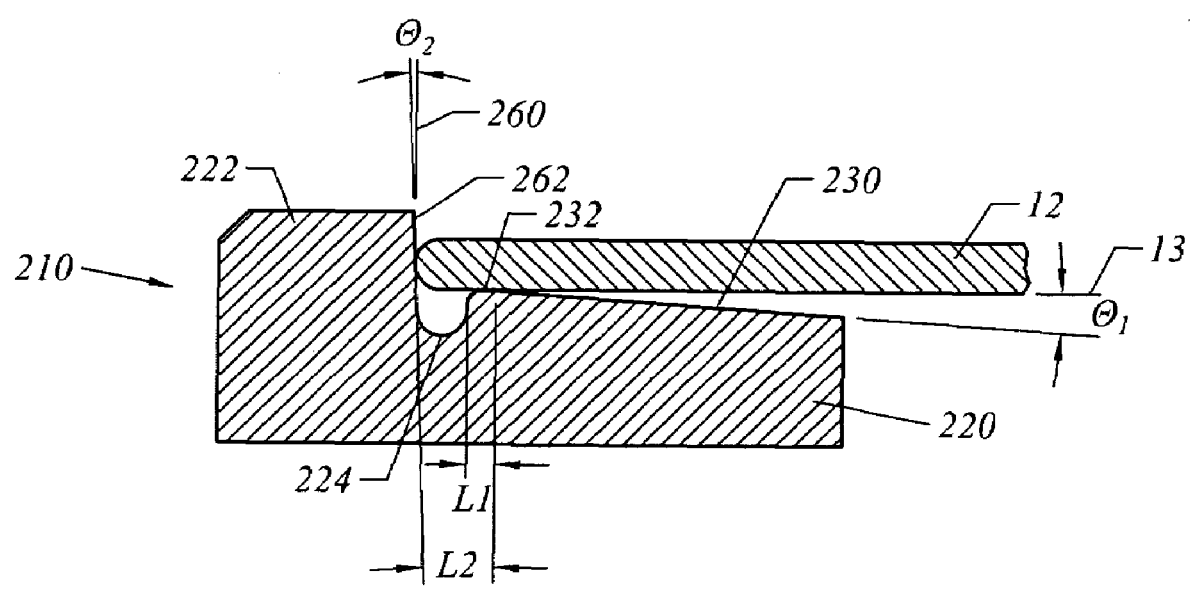
FIG. 10 is a side elevation cut-away view of a second embodiment of a distal rest pad.

FIG. 10 illustrates a second embodiment of a distal rest pad 210. In this embodiment, the distal rest pad 210 comprises a single element. Unlike the previous embodiments, the edge stop 222 and the bottom support pad 220 are not separately manufactured structures. The edge stop 222 has a wafer contact surface 262. The bottom support pad 220 has an inclined surface 230 that transitions into a flat surface 232 as the bottom support 220 extends towards the edge stop 222.

The wafer contact surface 262 of the edge stop 222 and the flat surface 232 of the bottom support pad 220 are separated by an edge relief groove 224. The edge relief groove 224, as shown in FIG. 10, forms a channel or trough area between the wafer contact surface 262 and the flat surface 232. The edge relief groove 224 may comprise other shapes. The edge relief groove 224 provides several advantages over the conventional rest pads shown in FIGS. 3-4. For example, the edge relief groove 224 provides a particulate collection area to keeps the particulates away from the top surface of the wafer. The edge relief groove 224 also provides an edge relief so that wafers with relatively square corners will sit in the same location on the support plate 102 as a wafer with a relatively round edge.

The width L1 of the flat surface 232 and the width of the edge relief groove 224 may vary. The total width of the flat surface 232 and the edge relief groove 224. (shown as L1+L2 in FIG. 10) is preferably not greater than 2 mm to ensure that the bottom surface of the wafer is only contacted within the exclusion zone. However, the total width may exceed 2 mm.

The wafer contact surface 262 shown in FIG. 10 forms an angle θ2 with a vertical plane 260. The angle θ2 may vary although it is preferred to form θ2 to be a shallow angle (e.g., 0-5°). A substantially vertical or over-vertical wafer contact surface 262 reduces scraping between the wafer's peripheral edge 14 and the wafer contact surface 262 during pick-up and drop off. This reduces particulate generation, improves drop off repeatability and reduces "catching" or failures to properly ungrip sticky wafers or inaccurately placed wafers The sloped surface 230 forms an angle θ1 with the imaginary plane 13. The angle θ1 is preferably a small angle, such as 2-4°, to reduce contact pressure, wear and particulate generation between the wafer and the inclined surface 230. The flat surface 232 distributes load and reduces sliding, wear and particle generation as the wafer 12 moves along the flat surface 232. All contact between the wafer 12 and the edge stop 222 is on either the peripheral edge of the wafer or the wafer's bottom surface 1-2 mm from the perimeter in accordance with the SEMI perimeter exclusion zone specification.

Although the invention has been described in detail herein, it should be understood that the invention is not limited to the embodiments herein disclosed. Various changes, substitutions and modifications may be made thereto by those skilled in the art without departing from the spirit or scope of the invention as described herein.

The invention claimed is:

1. A rest pad for supporting a workpiece, the rest pad being mounted to an end effector, comprising:
   a support pad having a proximal end, a distal end, and a support surface, said support surface including an inclined surface that transitions to a substantially flat surface at said distal end; and
   an edge stop having a wafer contact surface, an edge stop proximal end, and an edge stop distal end, said edge stop being located adjacent to said distal end of said support pad, wherein the support pad and the edge stop are maintained in fixed positions on the rest pad and the wafer contact surface and the support pad remain proximal to each other to restrain the workpiece;
   wherein a first imaginary vertical plane is defined to pass through a central axis of said support pad and a second imaginary vertical plane is defined to pass through a central axis of said edge stop, the first and second imaginary vertical planes are offset by an angle so that said first imaginary vertical plane does not intersect said edge stop, said central axis of said support pad extending between said proximal end and said distal end of said support pad and said central axis of said edge stop extending between the edge stop proximal end and the edge stop distal end.

2. The rest pad as recited in claim 1, wherein said support pad comprises a different material than said edge stop.

3. The rest pad as recited in claim 1, wherein said wafer contact surface of said edge stop forms an obtuse angle with said substantially flat surface of said support pad.

4. The rest pad as recited in claim 1, wherein said support pad includes a first protrusion and a second protrusion extending from a bottom surface of said support pad.

5. The rest pad as recited in claim 4, wherein said first protrusion comprises a different cross-sectional area than the cross-sectional area of said second protrusion.

6. The rest pad as recited in claim 5, further including a plurality of mounting holes in the end effector, and wherein two of said plurality of mounting holes are adapted to receive said first and second protrusions.

7. The rest pad as recited in claim 1, further including a first proximal rest pad and a second proximal rest pad mounted to said end effector.

8. The rest pad as recited in claim 1, wherein said support pad and said edge stop comprise a unitary structure.

9. A rest pad for supporting a workpiece seated on an end effector, comprising:
   a support pad having a proximal end and a distal end, a support surface, and a central axis extending from the proximal end to the distal end, said support surface including an inclined surface that transitions to a substantially flat surface at said distal end; and
   an edge stop pad having a wafer contact surface, said edge stop pad being located adjacent to said distal end of said support pad so that said central axis of said support pad does not intersect said wafer contact surface,
   wherein the support pad and the edge stop are maintained in fixed positions on the rest pad, and the wafer contact surface and the support pad remain proximal to each other to restrain the workpiece.

10. The rest pad as recited in claim 9, wherein said support pad comprises a different material than said edge stop pad.

11. The rest pad as recited in claim 9, wherein said wafer contact surface of said edge stop pad forms a 90° angle with said substantially flat surface of said support pad.

12. The rest pad as recited in claim 9, wherein said wafer contact surface of said edge stop forms an obtuse angle with said substantially flat surface of said support pad.

13. The rest pad as recited in claim 9, further including a first protrusion and a second protrusion extending from a bottom surface of said support pad.

14. The rest pad as recited inc claim 13, wherein said first protrusion comprises a different cross-sectional area than the cross-sectional area of said second protrusion.

15. The rest pad as recited in claim 9, further including a first proximal rest pad and a second proximal rest pad mounted on the end effector.

16. A rest pad for supporting a workpiece, the rest pad being mounted to an end effector, comprising:
   a support pad having a proximal end, a distal end, and a support surface, said support surface including an inclined surface that transitions to a substantially flat surface at said distal end and said support pad includes a first protrusion and a second protrusion extending from a bottom surface of said support pad; and
   an edge stop having a wafer contact surface, said edge stop being located adjacent to said distal end of said support pad,
   wherein an imaginary vertical plane passing through a central axis of said support pad does not intersect said wafer contact surface of said edge stop, said central axis extending between said proximal end and said distal end of said support pad.

17. A rest pad for supporting a workpiece seated on an end effector, comprising:
   a support pad having a proximal end and a distal end, a support surface, and a central axis extending from the proximal end to the distal end, said support surface including an inclined surface that transitions to a substantially flat surface at said distal end; and
   an edge stop pad having a wafer contact surface, said edge stop pad being located adjacent to said distal end of said support pad so that said central axis of said support pad does not intersect said wafer contact surface,
   wherein said support pad includes a first protrusion and a second protrusion extending from a bottom surface of said support pad.

* * * * *